United States Patent [19]

Matsuura

[11] Patent Number: 5,598,027
[45] Date of Patent: Jan. 28, 1997

[54] SEMICONDUCTOR DEVICE AND METHOD OF FABRICATING THE SAME

[75] Inventor: Masazumi Matsuura, Hyogo-ken, Japan

[73] Assignee: Mitsubishi Denki Kabushiki Kaisha, Tokyo, Japan

[21] Appl. No.: 575,842

[22] Filed: Dec. 21, 1995

Related U.S. Application Data

[63] Continuation of Ser. No. 37,133, Mar. 25, 1993, abandoned.

[30] Foreign Application Priority Data

Jun. 24, 1992 [JP] Japan .................................. 4-166179

[51] Int. Cl.⁶ .................................................. H01L 23/58
[52] U.S. Cl. .......................................... 257/635; 257/632
[58] Field of Search ................................... 257/635, 637, 257/639, 640, 641, 643, 644, 649, 650, 758, 759, 701, 632

[56] References Cited

U.S. PATENT DOCUMENTS

| | | | |
|---|---|---|---|
| 4,443,932 | 4/1984 | Mastroianni et al. | 257/648 |
| 4,832,789 | 5/1989 | Cochran et al. | 257/758 |
| 5,235,205 | 8/1993 | Lippitt, III | 257/538 |
| 5,321,211 | 6/1994 | Haslam et al. | |

FOREIGN PATENT DOCUMENTS

| | | |
|---|---|---|
| 21818A1 | 1/1981 | European Pat. Off. . |
| 46525A2 | 3/1982 | European Pat. Off. . |
| 3329065A1 | 2/1984 | Germany . |

OTHER PUBLICATIONS

"A Four-Level-Metal Fully Planarized Interconnet Technology for Dense High Performance Logic and SRAM Applications", Ronald R. Uttecht et al., VMIC Conference, Jun. 11–12, 1991, pp. 20–26.

"Dual Damascene: A ULSI Wiring Technology", Carter W. Kaanta et al., VMIC Conference, Jun. 11–12, 1991, pp. 144–151.

*Primary Examiner*—Sara W. Crane
*Assistant Examiner*—S. V. Clark
*Attorney, Agent, or Firm*—Lowe, Price, LeBlanc & Becker

[57] ABSTRACT

Disclosed herein is a semiconductor device, which can effectively prevent a lower insulating layer from formation of a recess resulting from etching during formation of a groove for connecting interconnection layers with each other. In this semiconductor device, a first etching prevention film is formed on a first interlayer insulating film, so that a second interlayer insulating film is formed on the first etching prevention film.

12 Claims, 8 Drawing Sheets

SEMICONDUCTOR DEVICE AND METHOD OF FABRICATING THE SAME

This application is a continuation of application Ser. No. 08/037,133 filed Mar. 25, 1993, abandoned.

BACKGROUND OF THE INVENTION

1. Field of the Invention

The present invention relates to a semiconductor device and a method of fabricating the same, and more particularly, it relates to a semiconductor device having a multilayer interconnection structure and a method of fabricating the same.

2. Description of the Background Art

A semiconductor device having a multilayer interconnection structure is well known in the art, as disclosed in "Proceedings of 11th International IEEE VLSI Multilevel Interconnect Conference", Jun. 11–12, 1991 VMIC Conference, p. 146, for example. FIG. 18 is a sectional view showing a conventional semiconductor device having a multilayer interconnection structure, which is disclosed in the aforementioned literature. Referring to FIG. 18, the conventional semiconductor device having a multilayer interconnection structure comprises a silicon semiconductor substrate 101, a first interlayer insulating film 102 having a groove a, which is formed on the silicon semiconductor substrate 101, a first interconnection layer 103 which is formed in the groove a, a second interlayer insulating film 104 having grooves b and c, which is formed on the first interlayer insulating film 102 and the first interconnection layer 103, and a second interconnection layer 105 which is formed in the grooves b and c to be electrically connected with the first interconnection layer 103.

FIGS. 19 to 26 are sectional structural diagrams for illustrating a fabrication process (first to eighth steps) for the conventional semiconductor device having a multilayer interconnection structure shown in FIG. 18. Referring to FIG. 18 and FIGS. 19 to 26, the fabrication process for the conventional semiconductor device having a multilayer interconnection structure is now described.

First, the first interlayer insulating film 102 is formed on the silicon semiconductor substrate 101, as shown in FIG. 19. The silicon semiconductor substrate 101 may alternatively be replaced by an element forming a circuit, such as a transistor or an insulating layer covering such an element, so that the first interlayer insulating film 102 is formed thereon.

Then, the groove a for the first interconnection layer 103 (see FIG. 18) is formed in the first interlayer insulating film 102 by photolithography and etching, as shown in FIG. 20.

Then, the first interconnection layer 103 is formed on the overall surface as shown in FIG. 21, and thereafter etched to expose the surface of the interlayer insulating film 102. Thus, the first interconnection layer 103 is finished in the shape shown in FIG. 22.

Then, the second interlayer insulating film 104 is formed on the overall surface, as shown in FIG. 23.

Then, the groove b for via hole contact is formed by photolithography and etching, as shown in FIG. 24.

Then, the groove c for the second interconnection layer 105 (see FIG. 18) is formed by photolithography and etching, as shown in FIG. 25.

Then, the second interconnection layer 105 is formed on the overall surface as shown in FIG. 26, and thereafter etched to expose the upper surface of the second interlayer insulating film 104. Thus, the second interconnection layer 105 is finished in the shape shown in FIG. 18.

However, the aforementioned conventional semiconductor device having a multilayer interconnection structure has the following problems: When pattern misregistration is caused during formation of the via hole contact groove b and the groove c for the second interconnection layer 105 in the fabrication steps shown in FIGS. 24 and 25, the upper surface of the first interlayer insulating film 102 is disadvantageously recessed by etching. FIG. 27 is a sectional structural diagram for illustrating this problem of the conventional semiconductor device having a multilayer interconnection structure. Referring to FIG. 27, a recess (cavity) d is inevitably formed in the first interlayer insulating film 102 if pattern misregistration is caused during formation of the via hole contact groove b and the groove c for the second interconnection layer 105, as described above. While the etching for forming the grooves b and c is generally stopped by the first interconnection layer 103, such etching undesirably influences the first interlayer insulating film 102 upon occurrence of pattern misregistration, to define the recess d. When such a recess d is defined to reach the underlayer of the first interconnection insulating layer 102, which may be formed by a circuit forming element such as a transistor, for example, a short may be caused across the second interlayer insulating film 102 and the circuit forming element, or the circuit forming element may be damaged.

SUMMARY OF THE INVENTION

An object of the present invention is to effectively prevent a first insulating layer of a semiconductor device from formation of a recess even if pattern misregistration is caused during formation of an opening in a second insulating layer which is provided on the first insulating layer.

Another object of the present invention is to readily prevent a first insulating layer of a semiconductor device from formation of a recess even if pattern misregistration is caused during formation of an opening in a second insulating layer which is provided on the first insulating layer in a method of fabricating the semiconductor device.

In a first aspect of the present invention, a semiconductor device having a multilayer interconnection structure comprises a first insulating layer having a first opening, which is formed on a semiconductor substrate, an etching prevention film which is formed on the first insulating layer, a first interconnection layer which is formed in the first opening, a second insulating layer having a second opening, which is formed on the etching prevention film and the first interconnection layer, and a second interconnection layer which is formed in the second opening to be electrically connected with the first interconnection layer.

In operation, the etching prevention film is so formed on the first insulating layer as to prevent the first insulating layer from influence by etching for forming the second opening even if pattern misregistration is caused during formation of the second opening in the second insulating layer. Thus, the first insulating layer is prevented from formation of a recess, dissimilarly to the conventional case.

In another aspect of the present invention, a method of fabricating a semiconductor device having a multilayer interconnection structure comprises a step of forming a first insulating layer having a first opening on a semiconductor substrate, a step of forming an etching prevention film on the first insulating layer, a step of forming a first interconnection layer in the first opening, a step of forming a second insulating layer on the etching prevention film and the first interconnection layer, a step of etching a prescribed region of the second insulating layer thereby forming a second opening, and a step of forming a second interconnection layer in the second opening to be electrically connected with the first interconnection layer.

In operation, the etching prevention film is formed on the first insulating layer and the second insulating layer is formed on the etching prevention film while a prescribed region of the second insulating layer is so etched as to form the second opening, whereby the first insulating layer is effectively prevented from influence by etching for forming the second opening even if pattern misregistration is caused during formation of the second opening. Thus, the first insulating layer is prevented from formation of a recess.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

Figure 1:
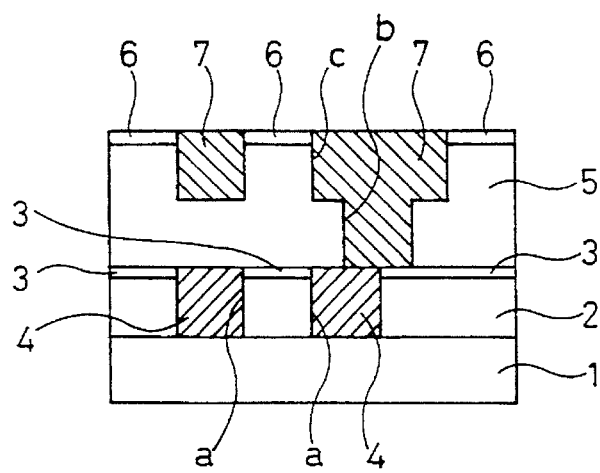
FIG. 1 is a sectional view showing a semiconductor device having a multilayer interconnection structure according to a first embodiment of the present invention.

Referring to FIG. 1, a semiconductor device according to a first embodiment of the present invention comprises a silicon semiconductor substrate 1, a first interlayer insulating film 2 having a groove a, which is formed on the silicon semiconductor substrate 1, a first interconnection layer 4 which is formed in the groove a, a first etching prevention film 3 which is formed on the first interlayer insulating film 2, a second interlayer insulating film 5 having grooves b and c, which is formed on the first etching prevention film 3 and the first interconnection layer 4, a second interconnection layer 7 which is formed in the grooves b and c to be electrically connected with the first interconnection layer 4, and a second etching prevention film 6 which is formed on the second interlayer insulating film 5.

According to the first embodiment, as hereinabove described, the first etching prevention film 3 is so formed on the first interlayer insulating film 2 that the upper surface of the first interlayer insulating film 2 is not influenced by etching for forming the grooves b and c even if pattern misregistration is caused during formation of the grooves b and c. Then, the first interlayer insulating film 2 is effectively prevented from formation of a recess, dissimilarly to the conventional case. When the silicon semiconductor substrate 1 serving as an underlayer for the first interlayer insulating film 2 is replaced by a circuit forming element such as a transistor, therefore, it is possible to prevent the circuit forming element from a short across the same and the second interconnection layer 7 as well as from damage.

Referring to FIG. 1 and FIGS. 2 to 9, a process of fabricating the semiconductor device according to the first embodiment is now described.

Figure 2:
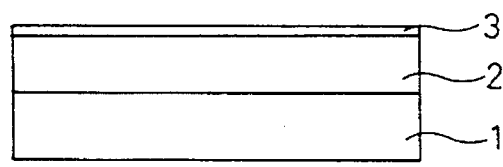
FIG. 2 is a sectional structural diagram for illustrating a first step in a process of fabricating the semiconductor device according to the first embodiment shown in FIG. 1.
Figure 10:
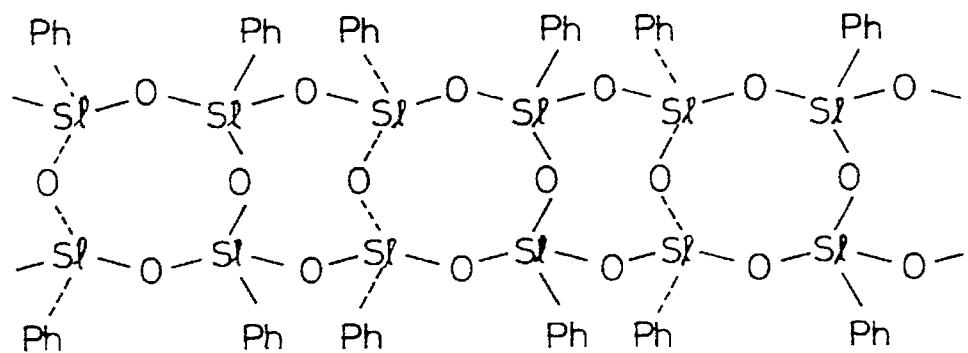
FIG. 10 typically illustrates the chemical formula of polyphenylsilsesquioxane.

First, the first interlayer insulating film 2 is formed on the silicon semiconductor substrate 1, as shown in FIG. 2. The etching prevention film 3 is formed on the first interlayer insulating film 2. The silicon semiconductor substrate 1 serving as an underlayer for the first interlayer insulating film 2 may be replaced by a circuit forming element such as a transistor and an insulating layer covering the same. The material for the etching prevention film 3 is prepared by rotation-coating polyphenylsilsesquioxane onto a film and curing the film (this film is hereinafter referred to as a PPSQ film). FIG. 10 typically illustrates the chemical formula of polyphenylsilsesquioxane. Such a PPSQ film is dry-etched at an etching rate of about ⅓ to ¼ of that for silicon oxide films, which are principal materials for the first and second interlayer insulating films 2 and 5. Thus, the PPSQ film has a sufficient effect for serving as an etching prevention film.

Figure 3:
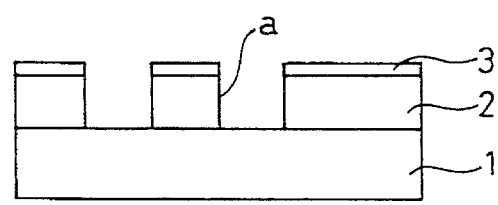
FIG. 3 is a sectional structural diagram for illustrating a second step in the process of fabricating the semiconductor device according to the first embodiment shown in FIG. 1.

Then, the groove a for the first interconnection layer 4 is formed through the first interlayer insulating film 2 and the first etching prevention film 3 by photolithography and etching, as shown in FIG. 3.

Figure 4:
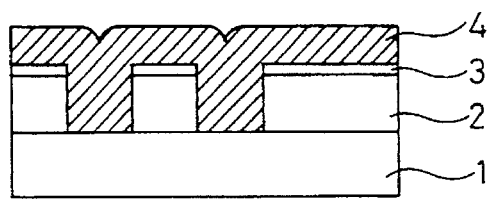
FIG. 4 is a sectional structural diagram for illustrating a third step in the process of fabricating the semiconductor device according to the first embodiment shown in FIG. 1.
Figure 5:
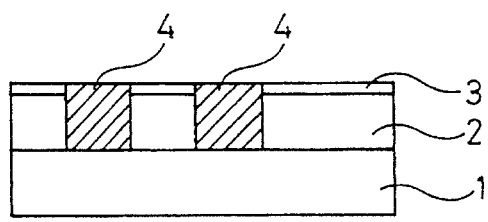
FIG. 5 is a sectional structural diagram for illustrating a fourth step in the process of fabricating the semiconductor device according to the first embodiment shown in FIG. 1.

Then, the first interconnection layer 4 is formed on the overall surface as shown in FIG. 4, and thereafter etched to expose the upper surface of the first etching prevention film 3. Thus, the first interconnection layer 4 is finished in the shape shown in FIG. 5. This etching step is carried out through chemical mechanical polishing, which is a method of applying an abrasive having a chemical etching effect on a wafer surface and pressing an abrasive pad against the wafer for mechanically etching the same. The first interconnection layer 4 may be dry-etched by general reactive gas such as $SF_6$, $NF_3$, Cl, $O_2$ or the like.

Figure 6:
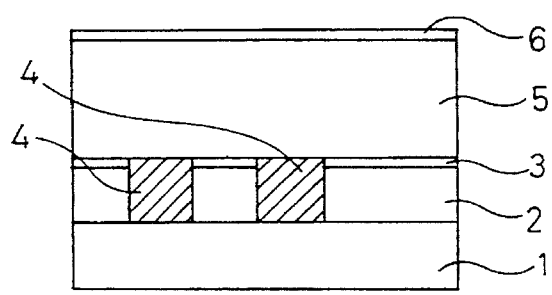
FIG. 6 is a sectional structural diagram for illustrating a fifth step in the process of fabricating the semiconductor device according to the first embodiment shown in FIG. 1.

Then, the second interlayer insulating film 5 is formed on the overall surface so that the second etching prevention film 6 is formed on this second interlayer insulating film 5, as shown in FIG. 6.

Figure 7:
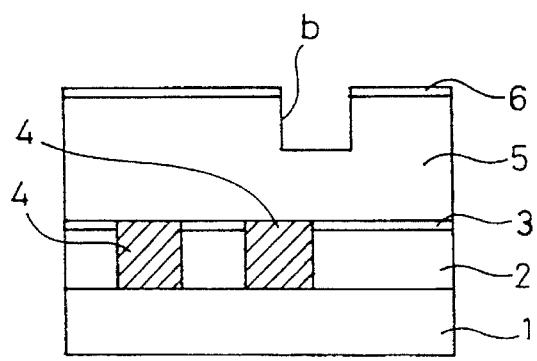
FIG. 7 is a sectional structural diagram for illustrating a sixth step in the process of fabricating the semiconductor device according to the first embodiment shown in FIG. 1.
Figure 8:
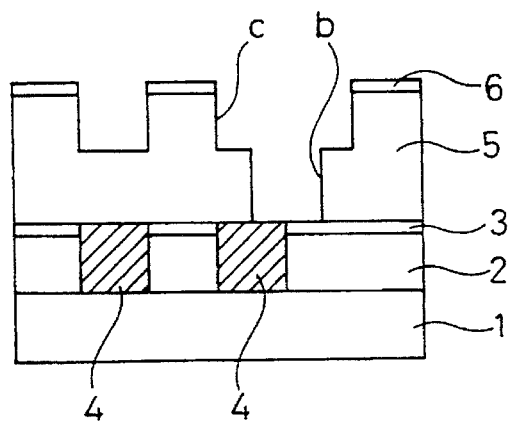
FIG. 8 is a sectional structural diagram for illustrating a seventh step in the process of fabricating the semiconductor device according to the first embodiment shown in FIG. 1.

Then, the via hole contact groove b having a desired pattern is formed by photolithography and etching as shown in FIG. 7, and thereafter the groove c for the second interconnection layer is formed as shown in FIG. 8. The grooves b and c are formed by dry etching with reactive gas. Even if pattern misregistration is caused during such formation of the grooves b and c, the first interlayer insulating film 2 is not influenced by the dry etching for forming the grooves b and c. In other words, the first etching prevention film 3 effectively prevents the first interlayer insulating film 2 from influence by the dry etching. Thus, the first interlayer insulating film 2 is prevented from formation of a recess, dissimilarly to the conventional case.

Figure 9:
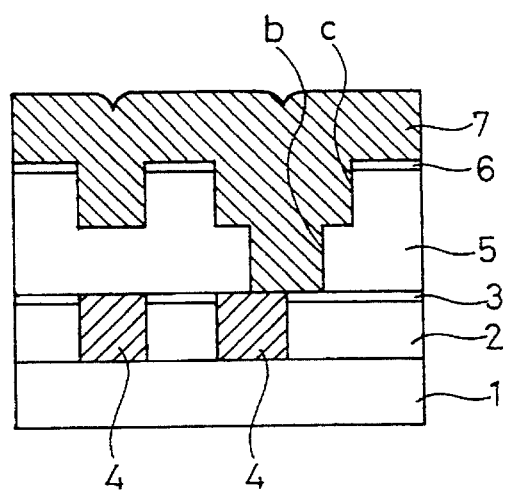
FIG. 9 is a sectional structural diagram for illustrating an eighth step in the process of fabricating the semiconductor device according to the first embodiment shown in FIG. 1.

Then, the second interconnection layer 7 is formed on the overall surface as shown in FIG. 9, and thereafter etched to expose the upper surface of the second etching prevention film 6. Thus, the second interconnection layer 7 is finished in the shape shown in FIG. 1.

Figure 11:
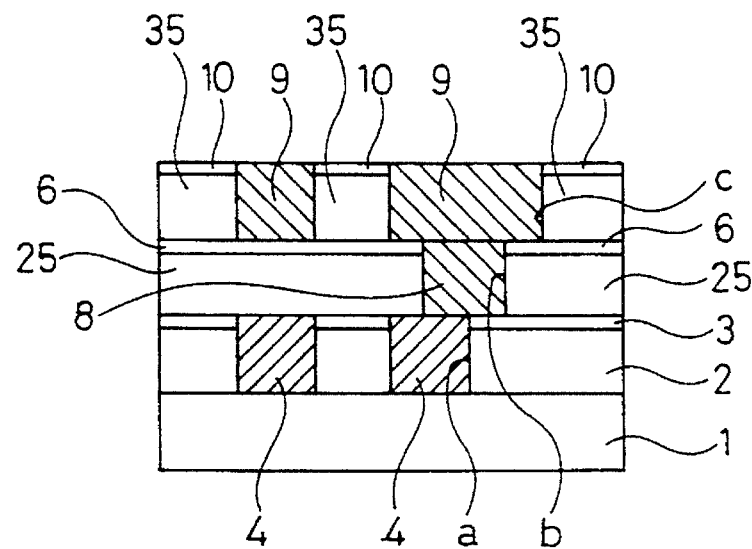
FIG. 11 is a sectional view showing a semiconductor device having a multilayer interconnection structure according to a second embodiment of the present invention.

Referring to FIG. 11 showing a semiconductor device according to a second embodiment of the present invention, a second interlayer insulating film 25 and a third interlayer insulating film 35 are separately formed to be provided with a via hole contact groove b and a groove c for a second interconnection layer 9 respectively. The second interlayer insulating film 25 having the via hole contact groove b is formed on a first etching prevention film 3 and a first interconnection layer 4. A second etching prevention film 6 is formed on the second interlayer insulating film 25. An interconnection layer 8 is formed in the groove b. The third interlayer insulating film 35 having the groove c for the second interconnection layer 9 is formed on the interconnection layer 8 and the second etching prevention film 6. The second interconnection layer 9 is formed in the groove c to be electrically connected with the interconnection layer 8. A third etching prevention film 10 is formed on the third interlayer insulating film 35.

Referring to FIG. 11 and FIGS. 12 to 17, a process for fabricating the semiconductor device according to the second embodiment is now described.

Figure 12:
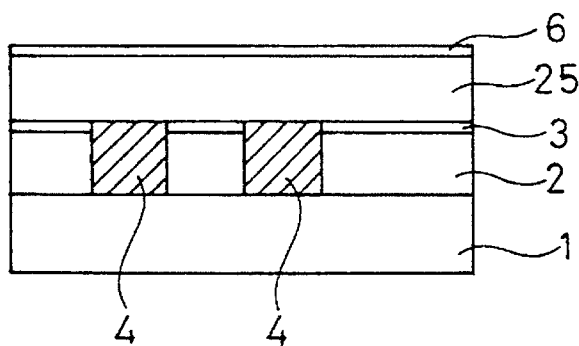
FIG. 12 is a sectional structural diagram for illustrating a first step in a process of fabricating the semiconductor device according to the second embodiment shown in FIG. 11.

First, the first interconnection layer 4 is formed as shown in FIG. 12 through a process similar to that of the first embodiment shown in FIGS. 2 to 5, so that the second interlayer insulating film 25 is formed thereon. Then the second etching prevention film 6 is formed on the second interlayer insulating film 25.

Figure 13:
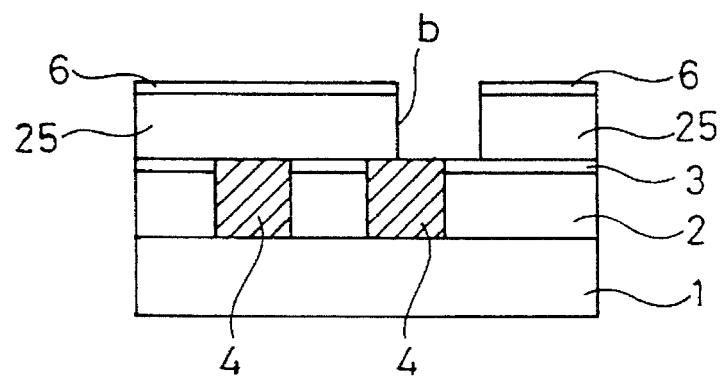
FIG. 13 is a sectional structural diagram for illustrating a second step in the process of fabricating the semiconductor device according to the second embodiment shown in FIG. 11.

Then, the via hole contact groove b is formed by photolithography and etching, as shown in FIG. 13.

Figure 14:
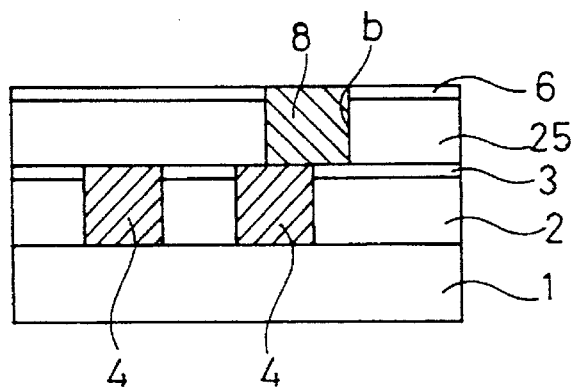
FIG. 14 is a sectional structural diagram for illustrating a third step in the process of fabricating the semiconductor device according to the second embodiment shown in FIG. 11.

Then, the first interconnection layer 8 is selectively formed in the groove b by CVD, as shown in FIG. 14. Alternatively, the interconnection layer 8 may be formed on the overall surface and thereafter etched to expose the upper surface of the first etching prevention film 3. Even if pattern misregistration is caused during formation of the groove b, the first etching prevention film 3 effectively prevents the first interlayer insulating film 2 from formation of a recess, dissimilarly to the conventional case.

Figure 15:
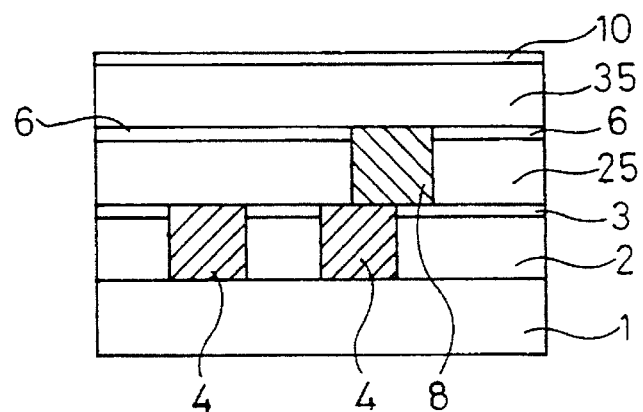
FIG. 15 is a sectional structural diagram for illustrating a fourth step in the process of fabricating the semiconductor device according to the second embodiment shown in FIG. 11.

Then, the third interlayer insulating film 35 is formed on the second etching prevention film 6 and the interconnection layer 8, as shown in FIG. 15. The third etching prevention film 10 is formed on the third interlayer insulating film 35.

Figure 16:
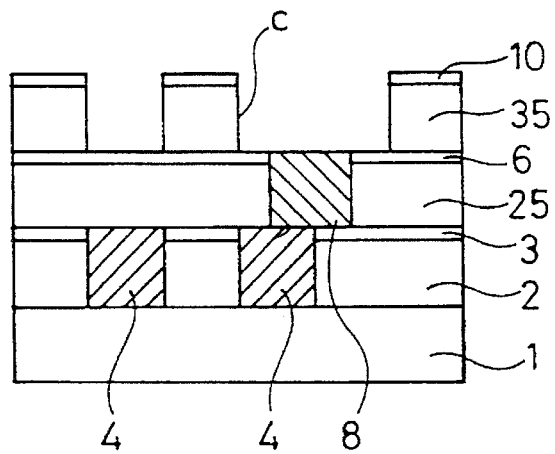
FIG. 16 is a sectional structural diagram for illustrating a fifth step in the process of fabricating the semiconductor device according to the second embodiment shown in FIG. 11.
Figure 17:
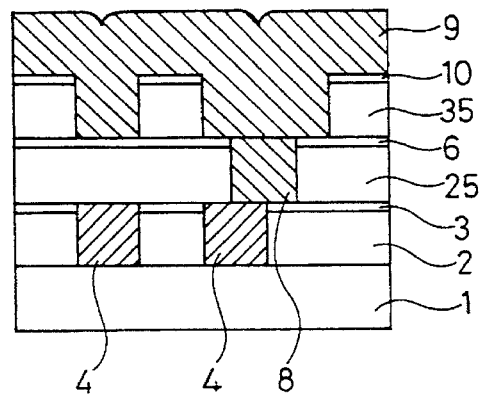
FIG. 17 is a sectional structural diagram for illustrating a sixth step in the process of fabricating the semiconductor device according to the second embodiment shown in FIG. 11.
Figure 18:
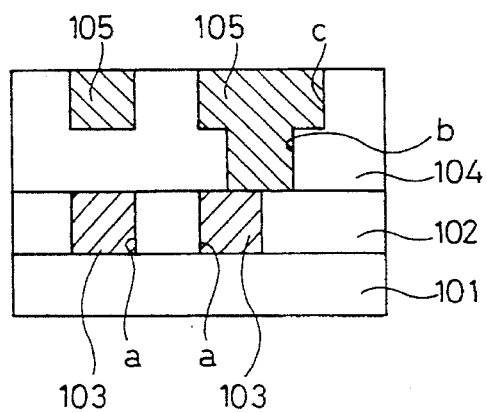
FIG. 18 is a sectional view showing a conventional semiconductor device having a multilayer interconnection structure.
Figure 19:
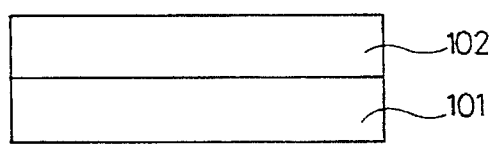
FIG. 19 is a sectional structural diagram for illustrating a first step in a process of fabricating the conventional semiconductor device shown in FIG. 18.
Figure 20:
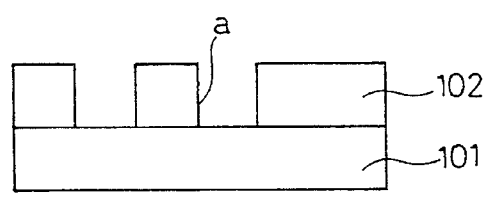
FIG. 20 is a sectional structural diagram for illustrating a second step in the process of fabricating the conventional semiconductor device shown in FIG. 18.
Figure 21:
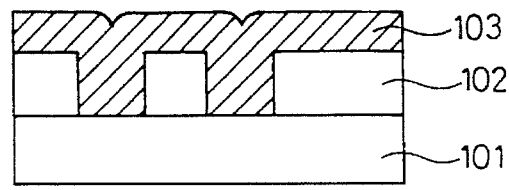
FIG. 21 is a sectional structural diagram for illustrating a third step in the process of fabricating the conventional semiconductor device shown in FIG. 18.
Figure 22:
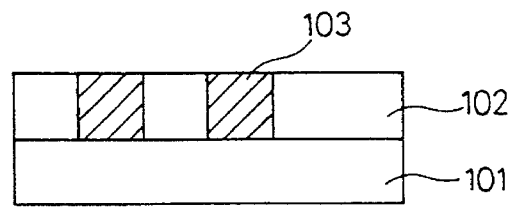
FIG. 22 is a sectional structural diagram for illustrating a fourth step in the process of fabricating the conventional semiconductor device shown in FIG. 18.
Figure 23:
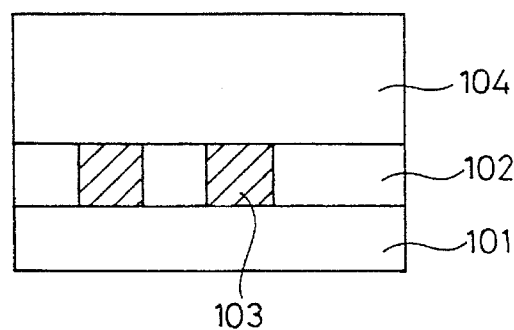
FIG. 23 is a sectional structural diagram for illustrating a fifth step in the process of fabricating the conventional semiconductor device shown in FIG. 18.
Figure 24:
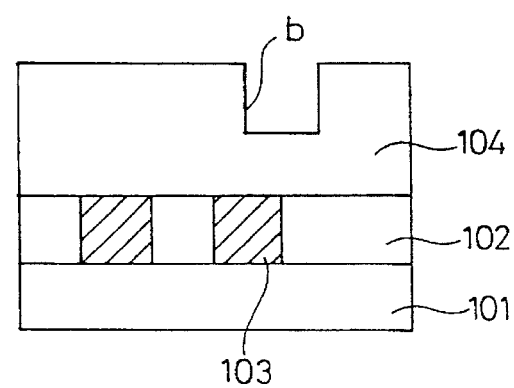
FIG. 24 is a sectional structural diagram for illustrating a sixth step in the process of fabricating the conventional semiconductor device shown in FIG. 18.
Figure 25:
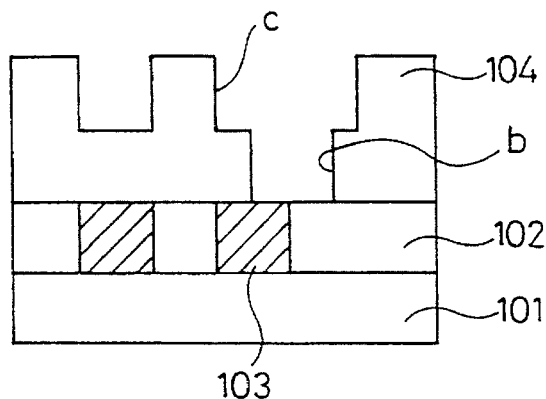
FIG. 25 is a sectional structural diagram for illustrating a seventh step in the process of fabricating the conventional semiconductor device shown in FIG. 18.
Figure 26:
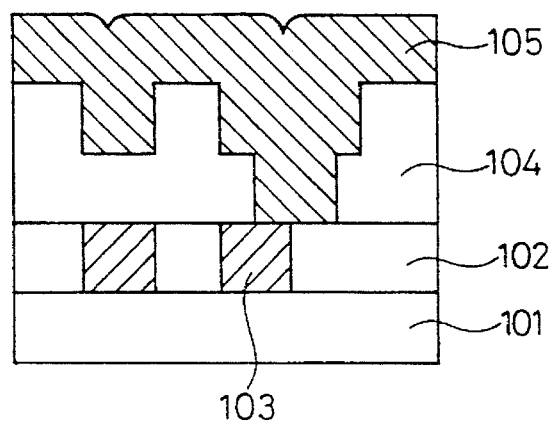
FIG. 26 is a sectional structural diagram for illustrating an eighth step in the process of fabricating the conventional semiconductor device shown in FIG. 18.
Figure 27:
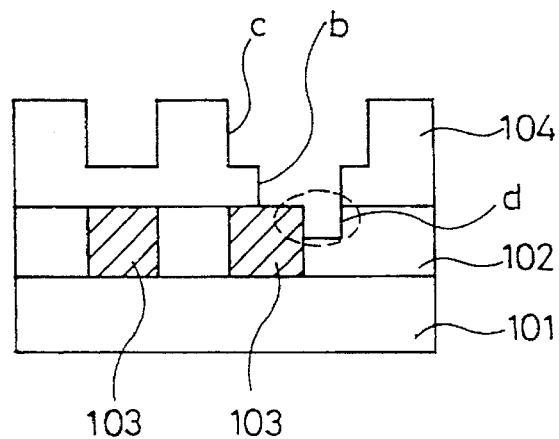
FIG. 27 is a sectional structural diagram for illustrating a problem in the conventional semiconductor device having a multilayer interconnection structure.

Then, the groove c is formed by photolithography and etching, as shown in FIG. 16. Then, the second interconnection layer 9 is formed to cover the overall surface, as shown in FIG. 17. Finally, the second interconnection layer 9 is etched to expose the upper surface of the third etching prevention film 10. Thus, the second interconnection layer 9 is finished in the shape shown in FIG. 11. Even if pattern misregistration is caused during formation of the groove c in the step shown in FIG. 16, the second etching prevention film 6 protects the second interlayer insulating film 25 against etching, thereby effectively preventing the same from formation of a recess.

In each of the first and second embodiments of the present invention, as hereinabove described, the etching prevention film which is etched at a slower rate than the principal material for the interlayer insulating film is formed on the interlayer insulating film, whereby it is possible to prevent the lower interlayer insulating film from formation of a recess resulting from etching, even if pattern misregistration is caused during formation of the via hole contact groove and the groove for receiving the upper interconnection layer.

According to the inventive semiconductor device, the etching prevention film is formed on the first insulating layer, so that the first insulating layer is prevented from influence by etching for forming the second opening even if pattern misregistration is caused during formation of the second opening in the second insulating layer which is formed on the etching prevention film. Thus, the first insulating layer is effectively prevented from formation of a cavity. Therefore, when a circuit forming element such as a transistor is formed as an underlayer for the first insulating layer, for example, such a circuit forming element is damaged and it is possible to prevent a short across the second interconnection layer and the circuit forming element.

According to the inventive method of fabricating a semiconductor device, the etching prevention film is formed on the first insulating layer and the second insulating layer is formed on the etching prevention film so that a prescribed region of the second insulating layer is etched to form the second opening, whereby the first insulating layer is prevented from influence by etching for forming the second opening, even if pattern misregistration is caused during formation of the second opening. Thus, it is possible to effectively prevent the first insulating layer from formation of a recess.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a multilayer interconnection structure, comprising:

a first insulating layer having a first opening, the first insulating layer being formed on a semiconductor substrate;

a first etching prevention film formed on said first insulating layer;

a first interconnection layer formed in said first opening;

a second insulating layer having a second opening, the second insulating layer being formed on said first etching prevention film and said first interconnection layer; and a second interconnection layer formed in said second opening and formed on and electrically connected with said first interconnection layer, said second interconnection layer being further formed on and in contact with an upper surface of said first etching prevention film, wherein said first etching prevention film is in direct contact with a side surface of said first interconnection layer and an upper surface of said first insulating layer.

2. A semiconductor device in accordance with claim 1, wherein said first etching prevention film is a polyphenylsilsesquioxane film (PPSQ film).

3. A semiconductor device in accordance with claim 1, wherein said second opening includes a via hole contact opening having a first inner diameter, and an interconnection opening having a second inner diameter being larger than said first inner diameter.

4. A semiconductor device having a multilayer interconnection structure, comprising:

a first insulating layer having a first opening, the first insulating layer being formed on a semiconductor substrate;

a first etching prevention film formed on said first insulating layer;

a first interconnection layer formed in said first opening;

a second insulating layer having a second opening, the second insulating layer being formed on said first etching prevention film and said first interconnection layer;

a second interconnection layer formed in said second opening and electrically connected with said first interconnection layer;

a second etching prevention film formed on said second insulating layer;

a third insulating layer having a third opening, the third insulating layer being formed on said second etching prevention film and said second interconnection layer, and a third interconnection layer formed in said third opening and electrically connected with said second interconnection layer, wherein said first and second etching prevention films are in direct contact with a side surface of said first and second interconnection layers, respectively, and an upper surface of said first and second insulating layer, respectively.

5. A semiconductor device in accordance with claim 1, wherein the first and second insulating layers are formed of silicon dioxide.

6. A semiconductor device in accordance with claim 4, wherein said third interconnection layer is formed on said second interconnection layer and said second etching prevention film in contact with the same.

7. A semiconductor device in accordance with claim 4, wherein the first, second and third insulating layers are formed of silicon dioxide.

8. A semiconductor device in accordance with claim 4, wherein the first and second etching prevention films are formed of polyphenylsilsesquioxane.

9. The semiconductor device according to claim 1, wherein said first etching prevention film is in direct contact with side surfaces of said first interconnection layer.

10. A semiconductor device having a multilayer interconnection structure, comprising:

a first insulating layer having a first opening, the first insulating layer being formed on a semiconductor substrate;

a first etching prevention film formed on said first insulating layer;

a first interconnection layer formed in said first opening;

a second insulating layer having a second opening, the second insulating layer being formed on said first etching prevention film and on and in direct contact with an upper surface of said first interconnection layer; and a second interconnection layer formed in said second opening and formed on and electrically connected with said first interconnection layer, said second interconnection layer being further formed on and in contact with an upper surface of said first etching prevention film.

11. A semiconductor device having a multilayer interconnection structure, comprising:

a first insulating layer having a first opening, the first insulating layer being formed on a semiconductor substrate;

a first etching prevention film formed on said first insulating layer;

a first interconnection layer formed in said first opening;

a second insulating layer having a second opening, the second insulating layer being formed on said first etching prevention film and on and in direct contact with an upper surface of said first interconnection layer;

a second interconnection layer formed in said second opening and electrically connected with said first interconnection layer;

a second etching prevention film formed on said second insulating layer;

a third insulating layer having a third opening, the third insulating layer being formed on said second etching prevention film and said second interconnection layer, and a third interconnection layer formed in said third opening and electrically connected with said second interconnection layer.

12. The semiconductor device according to claim 4, wherein said first and second etching prevention films are formed in direct contact with side surfaces of said first and second interconnection layers.

* * * * *